US012787325B2

(12) United States Patent
Nishi et al.

(10) Patent No.: US 12,787,325 B2
(45) Date of Patent: Nov. 3, 2026

(54) SEMICONDUCTOR DEVICE AND METHOD FOR MANUFACTURING THE SAME

(71) Applicant: Mitsubishi Electric Corporation, Tokyo (JP)

(72) Inventors: Koichi Nishi, Tokyo (JP); Shinya Soneda, Tokyo (JP); Akihiko Furukawa, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 766 days.

(21) Appl. No.: 17/568,671

(22) Filed: Jan. 4, 2022

(65) Prior Publication Data

US 2022/0302289 A1 Sep. 22, 2022

(30) Foreign Application Priority Data

Mar. 16, 2021 (JP) ................................ 2021-042533

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/038* (2025.01); *H10D 62/109* (2025.01);
(Continued)

(58) Field of Classification Search
CPC ............... H01L 29/407; H01L 29/7813; H01L 29/66734; H01L 29/1095; H01L 29/7395;
(Continued)

(56) References Cited

U.S. PATENT DOCUMENTS

2001/0052617 A1* 12/2001 Kitada ................. H10D 62/111 257/E21.384
2006/0065926 A1* 3/2006 Kubo ................. H10D 30/0297 257/330
(Continued)

FOREIGN PATENT DOCUMENTS

CN 1770468 A 5/2006
CN 102983164 A 3/2013
(Continued)

OTHER PUBLICATIONS

Kuroi, Takashi et al. The Impact of Nitrogen Implantation into Highly Doped Polysilicon Gates for Highly Reliable and High-Performance Sub-Quarter-Micron Dual-Gate Complementary Metal Oxide Semiconductor. Jpn. J. Appl. Phys. 34 771 (Year: 1995).*
(Continued)

*Primary Examiner* — Jessica S Manno
*Assistant Examiner* — Victor Joseph Lasasso
(74) *Attorney, Agent, or Firm* — Studebaker Brackett PLLC

(57) ABSTRACT

Hysteresis of gate leakage is reduced in a semiconductor device with a structure including embedded electrodes below gate trench electrodes. A semiconductor device includes an active trench gate formed in a trench coming in contact with an emitter layer, a base layer, and a carrier storage layer to reach a drift layer. The active trench gate includes: a gate trench insulating film formed on an inner wall of the trench; and a gate trench electrode, and an embedded electrode below the gate trench electrode, the gate trench electrode and the embedded electrode being formed on the gate trench insulating film in the trench and being insulated from each other. The embedded electrode is lower in phosphorus concentration than the gate trench electrode.

10 Claims, 5 Drawing Sheets

(51) Int. Cl.

| | |
|---|---|
| ***H10D 62/10*** | (2025.01) |
| ***H10D 62/17*** | (2025.01) |
| ***H10D 64/00*** | (2025.01) |
| ***H10W 10/00*** | (2026.01) |
| ***H10W 10/50*** | (2026.01) |

(52) U.S. Cl.
CPC ......... *H10D 62/393* (2025.01); *H10D 64/117* (2025.01); *H10W 10/051* (2026.01); *H10W 10/50* (2026.01)

(58) Field of Classification Search
CPC .............. H01L 29/7397; H10D 12/038; H10D 64/117; H10D 12/481; H10D 30/668; H10D 62/111; H10D 62/127; H10D 62/40; H10D 64/111; H10D 62/393; H10D 64/513; H10D 62/8325
See application file for complete search history.

(56) References Cited

U.S. PATENT DOCUMENTS

| | | | | |
|---|---|---|---|---|
| 2009/0026535 | A1 | 1/2009 | Matsuura et al. | |
| 2010/0117144 | A1 | 5/2010 | Hirler et al. | |
| 2012/0025303 | A1 | 2/2012 | Hirler et al. | |
| 2013/0001681 | A1 * | 1/2013 | Sin ...................... | H01L 29/4236 438/270 |
| 2013/0056790 | A1 | 3/2013 | Kawamura | |
| 2013/0069150 | A1 | 3/2013 | Matsuoka et al. | |
| 2014/0339600 | A1 | 11/2014 | Yoshikawa | |
| 2015/0235866 | A1 * | 8/2015 | Nakamura ........... | H10D 62/112 257/77 |
| 2019/0006495 | A1 | 1/2019 | Ogura et al. | |
| 2019/0115436 | A1 * | 4/2019 | Hossain ............... | H10D 64/513 |
| 2020/0144403 | A1 | 5/2020 | Nishi | |

FOREIGN PATENT DOCUMENTS

| | | | |
|---|---|---|---|
| CN | 104145342 | A | 11/2014 |
| JP | 2009-032951 | A | 2/2009 |
| JP | 2013-58575 | A | 3/2013 |
| JP | 2013-65774 | A | 4/2013 |
| JP | 2014-216444 | A | 11/2014 |
| JP | 2017-147431 | A | 8/2017 |
| JP | 2019-12813 | A | 1/2019 |
| JP | 2020-077727 | A | 5/2020 |

OTHER PUBLICATIONS

Kuroi reference (Year: 1995).*
An Office Action; "Notice of Reasons for Refusal," mailed by the Japanese Patent Office on Jan. 23, 2024, which corresponds to Japanese Patent Application No. 2021-042533 and is related to U.S. Appl. No. 17/568,671; with English language translation.
Office Action issued in DE 10 2022 102 516.0; mailed by the German Patent and Trademark Office on Nov. 4, 2024.
An Office Action mailed by China National Intellectual Property Administration on May 22, 2025, which corresponds to Chinese Patent Application No. 202210237812.2 and is related to U.S. Appl. No. 17/568,671; with English language translation.

* cited by examiner

SEMICONDUCTOR DEVICE AND METHOD FOR MANUFACTURING THE SAME

BACKGROUND OF THE INVENTION

Field of the Invention

The present disclosure relates to a semiconductor device and a method for manufacturing the same.

Description of the Background Art

In the field of general-purpose inverters and AC servos, insulated-gate bipolar transistors (IGBTs) and diodes are used, in view of saving energy, in power modules that perform variable-speed control on three-phase motors. Such IGBTs and diodes in the power modules require a low switching loss and a low ON voltage to reduce the loss in the inverters.

Trench-gate IGBTs each including gate electrodes (gate trench electrodes) formed in trenches are devices low in switching loss. Particularly, IGBTs each with a structure in which embedded electrodes are formed below the gate trench electrodes are known as devices low in gate capacitance (for example, Japanese Patent Application Laid-Open No. 2020-077727). In the IGBT including the gate trench electrodes and the embedded electrodes, the gate trench electrodes are coupled to a gate potential, and the embedded electrodes are coupled to an emitter potential. Thereby, the gate trench electrodes are shielded by the embedded electrodes, which results in a low gate capacitance.

In the IGBT including the gate trench electrodes and the embedded electrodes, the gate trench electrodes and the embedded electrodes are generally made of doped polysilicon to which phosphorus has been added. When phosphorus segregates at an interface between each of the gate trench electrodes and the embedded electrodes and an insulating film (a gate trench insulating film) formed on the surface of the gate trench electrodes and the embedded electrodes, a problem of an increase in hysteresis of gate leakage of the IGBT occurs.

For example, when a positive bias is applied to the gate, electrons are easily trapped in a segregation portion of phosphorus formed at the interface between the embedded electrode and the gate trench insulating film. This causes an increase in hysteresis of gate leakage (positive gate leakage). Furthermore, when a negative bias is applied to the gate, electrons are easily trapped in a segregation portion of phosphorus formed at the interface between the gate trench electrode and the gate trench insulating film. This causes an increase in hysteresis of gate leakage (negative gate leakage).

One of the causes of the segregation of phosphorus at the interface between the embedded electrodes and the gate trench insulating films is a larger number of heat treatment processes to be applied on the embedded electrodes, because the gate trench insulating films are formed after the embedded electrodes are formed in the processes for manufacturing the IGBT.

SUMMARY

The present disclosure has an object of reducing hysteresis of gate leakage in a semiconductor device with a structure including embedded electrodes below gate trench electrodes.

A semiconductor device according to the present disclosure includes a semiconductor substrate, a carrier storage layer, a base layer, an emitter layer, a contact layer, and an active trench gate. The semiconductor substrate includes a first principal surface, a second principal surface, and a drift layer of a first conductivity type. The carrier storage layer is a region of the first conductivity type formed closer to the first principal surface than the drift layer in the semiconductor substrate, the carrier storage layer being higher in peak impurity concentration than the drift layer. The base layer is a region of a second conductivity type formed closer to the first principal surface than the carrier storage layer in the semiconductor substrate. The emitter layer is a region of the first conductivity type formed in contact with the first principal surface in the semiconductor substrate. The contact layer is a region of the second conductivity type formed in contact with the first principal surface in the semiconductor substrate. The active trench gate is formed in a trench coming in contact with the emitter layer, the base layer, and the carrier storage layer to reach the drift layer. The active trench gate includes: a gate trench insulating film formed on an inner wall of the trench; and a gate trench electrode, and an embedded electrode closer to the second principal surface than the gate trench electrode, the gate trench electrode and the embedded electrode being formed on the gate trench insulating film in the trench and being insulated from each other. The embedded electrode is lower in phosphorus concentration than the gate trench electrode.

Hysteresis of gate leakage can be reduced in a semiconductor device with a structure including embedded electrodes below gate trench electrodes.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
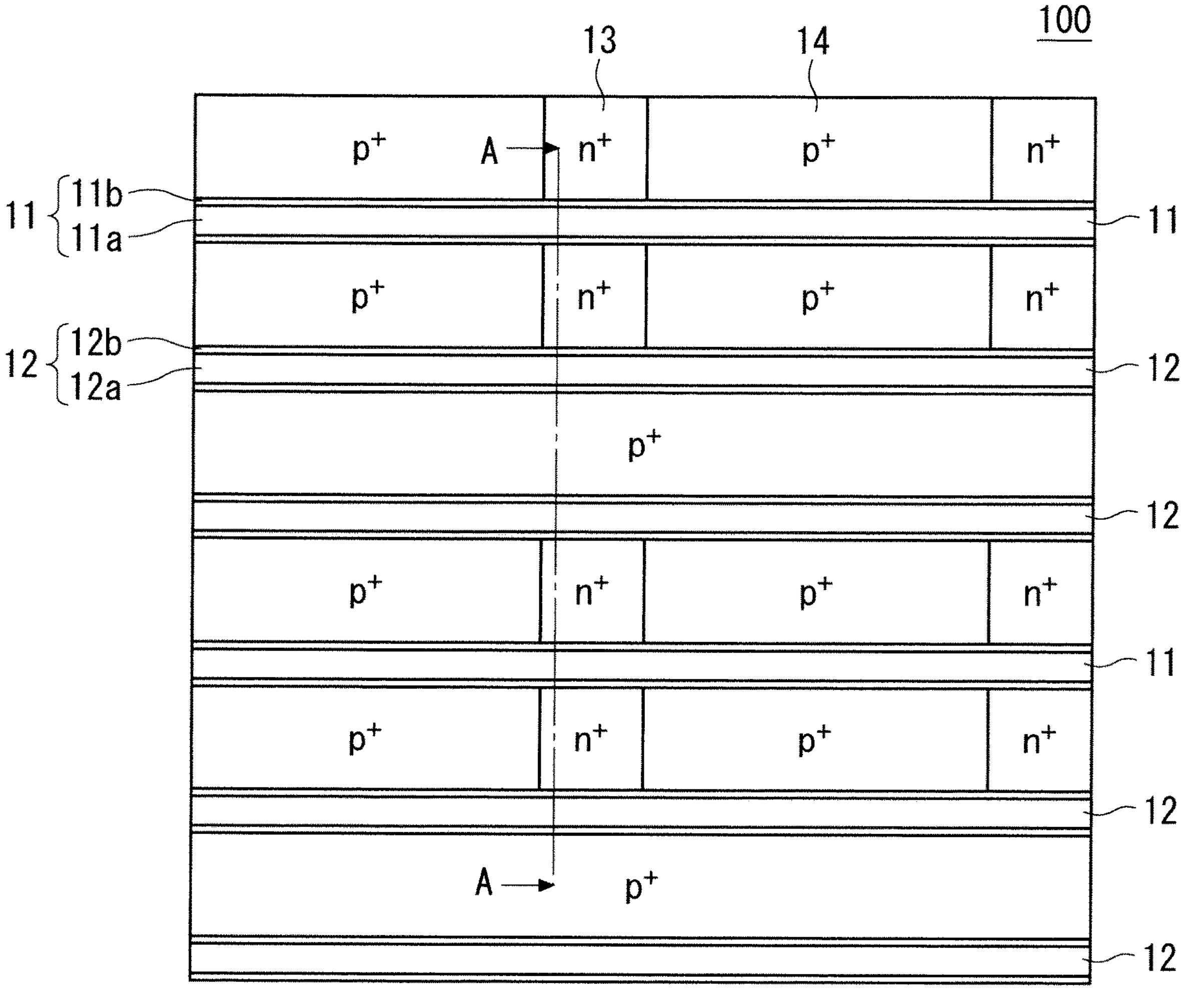
FIG. 1 is a plan view of a semiconductor device according to Embodiment 1.
Figure 2:
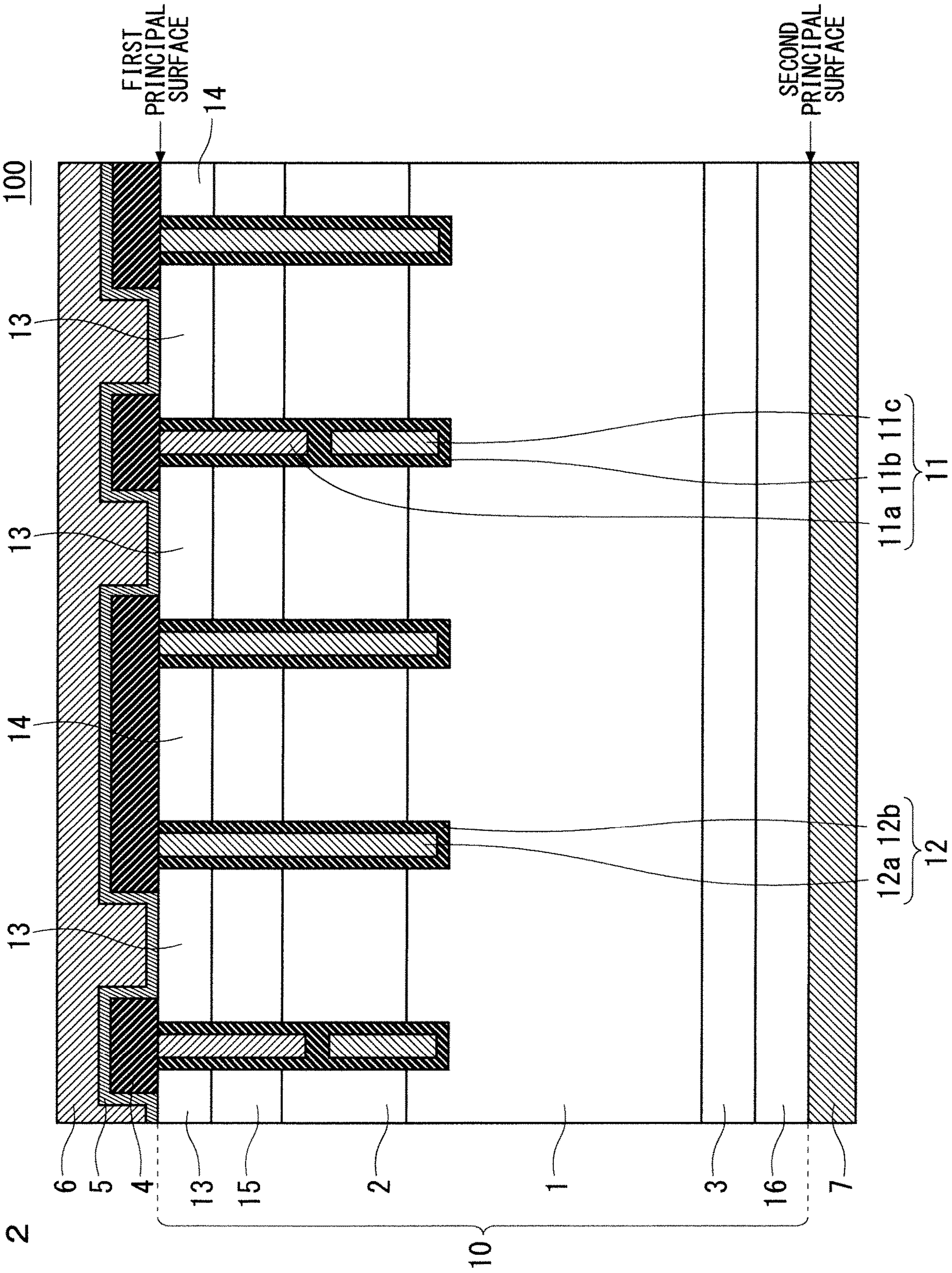
FIG. 2 is a cross-sectional view of the semiconductor device according to Embodiment 1.

FIG. 1 is a plan view of a semiconductor device 100 according to Embodiment 1. FIG. 2 is a cross-sectional view of the semiconductor device 100 which is taken along the line A-A of FIG. 1. A structure of an IGBT is used as a device structure of the semiconductor device 100 according to Embodiment 1. However, the technology of the present disclosure is applicable not only to IGBTs but widely to power devices including metal-oxide-semiconductor field-effect transistors (MOSFETs) and reverse conducting IGBTs (RC-IGBTs).

There is no particular constraint on the breakdown-voltage class of the semiconductor device 100, or the type of a semiconductor substrate to be used as a semiconductor substrate 10 (e.g., floating zone (FZ) substrate, magnetic-field applied Czochralski (MCZ) substrate, and epitaxial substrate). The semiconductor substrate 10 may be made of a wide bandgap semiconductor such as silicon carbide (SiC), a gallium nitride (GaN) based material, or diamond, besides silicon (Si). The use of the wide bandgap semiconductor can lead to a high breakdown voltage, low loss, and high heat resistance.

Although the first conductivity type is n-type and the second conductivity type is p-type as the conductivity types of semiconductors herein, the first conductivity type may be p-type and the second conductivity type may be n-type.

The semiconductor device 100 including the semiconductor substrate 10 including a drift layer 1 of the first conductivity type (n-type) is formed. In FIG. 1, the upper surface of the semiconductor substrate 10 is defined as "a first principal surface", and the lower surface thereof is defined as "a second principal surface".

In the semiconductor substrate 10, a carrier storage layer 2 of the first conductivity type which is higher in peak impurity concentration than the drift layer 1 is formed closer to the first principal surface than the drift layer 1. Furthermore, a base layer 15 of the second conductivity type (p-type) is formed closer to the first principal surface than the carrier storage layer 2. Furthermore, an emitter layer 13 of the first conductivity type, and a contact layer 14 of the second conductivity type which is higher in peak impurity concentration than the base layer 15 are formed in contact with the first principal surface and closer to the first principal surface than the base layer 15.

Furthermore, trenches reaching the drift layer 1 through the emitter layer 13, the base layer 15, and the carrier storage layer 2 are formed in the first principal surface of the semiconductor substrate 10. Thus, the trenches come in contact with the emitter layer 13, the base layer 15, and the carrier storage layer 2, and have bottom portions closer to the second principal surface than a boundary between the drift layer 1 and the carrier storage layer 2. An active trench gate 11 or a dummy trench gate 12 is formed in each of the trenches.

The active trench gate 11 includes a gate trench insulating film 11*b* formed on an inner wall of the trench, and a gate trench electrode 11*a* and an embedded electrode 11*c* that are formed on the gate trench insulating film 11*b*. The embedded electrode 11*c* is formed closer to the second principal surface than the gate trench electrode 11*a*. The gate trench insulating film 11*b* is interposed between the gate trench electrode 11*a* and the embedded electrode 11*c*. In other words, the gate trench electrode 11*a* and the embedded electrode 11*c* are insulated from each other. The bottom portion of the gate trench electrode 11*a* is closer to the second principal surface than a boundary between the base layer 15 and the carrier storage layer 2.

The dummy trench gate 12 includes a dummy trench insulating film 12*b* formed on an inner wall of the trench, and a dummy trench electrode 12*a* formed on the dummy trench insulating film 12*b*. In other words, the dummy trench gate 12 does not include an embedded electrode. The semiconductor device 100 needs at least the active trench gate 11 out of the active trench gate 11 and the dummy trench gate 12. The dummy trench gate 12 may be omitted.

An interlayer insulating film 4 covering the gate trench electrodes 11*a* and the dummy trench electrodes 12*a* is formed on the first principal surface of the semiconductor substrate 10. An emitter electrode 6 is formed on the interlayer insulating film 4. The emitter electrode 6 is connected to the emitter layer 13 and the contact layer 14 through contact holes formed in the interlayer insulating film 4. Furthermore, the embedded electrodes 11*c* of the active trench gates 11 are connected to the emitter electrode 6 in a region not illustrated. Thus, the emitter electrode 6 is electrically connected to the active trench gates 11.

A barrier metal 5 is provided on the lower surface of the emitter electrode 6 according to Embodiment 1. The emitter electrode 6 can be made of a metal, for example, Al or AlSi. The barrier metal 5 can be made of, for example, Ti, TiN, or TiSi. Furthermore, the emitter electrode 6 may include plugs made of, for example, W in the contact holes.

In the semiconductor substrate 10, a buffer layer 3 higher in peak impurity concentration than the drift layer 1 is formed closer to the second principal surface than the drift layer 1. A collector layer 16 of the second conductivity type is formed in contact with the second principal surface and closer to the second principal surface than the buffer layer 3. Furthermore, a collector electrode 7 connected to the collector layer 16 is formed on the second principal surface of the semiconductor substrate 10.

In Embodiment 1, the gate trench electrodes 11*a* and the embedded electrodes 11*c* are made of doped polysilicon to which phosphorus has been added. The concentration of phosphorus contained in the embedded electrodes 11*c* is set lower than that of phosphorus contained in the gate trench electrodes 11*a*. Thus, lowering phosphorus concentration in the embedded electrodes 11*c* can reduce phosphorus that segregates between the embedded electrodes 11*c* and the gate trench insulating films 11*b*, and reduce hysteresis of positive gate leakage. The phosphorus concentration in the dummy trench electrodes 12*a* may be identical to that of the embedded electrodes 11*c*.

Embodiment 2

The structure of a semiconductor device 100 according to Embodiment 2 is basically identical to that in FIGS. 1 and 2. In Embodiment 2, the embedded electrodes 11*c* are made of a material excluding phosphorus. Examples of the material of the embedded electrodes 11*c* include non-doped polysilicon, doped polysilicon to which nitrogen has been added, and metals. When compared to doped polysilicon to which phosphorus has been added as the material of the embedded electrodes 11*c* in Embodiment 1, non-doped polysilicon increases the electrical resistance of the embedded electrodes 11*c*, but doped polysilicon to which nitrogen has been added or the metals can reduce the electrical resistance of the embedded electrodes 11*c*.

Since the embedded electrodes 11*c* exclude phosphorus in Embodiment 2, the segregation of phosphorus at the interface between the embedded electrodes 11*c* and the gate trench insulating films 11*b* can be prevented, and hysteresis of positive gate leakage can be reduced. The dummy trench electrodes 12*a* may be made of a material identical to that of the embedded electrodes 11*c*.

Embodiment 3

Figure 3:
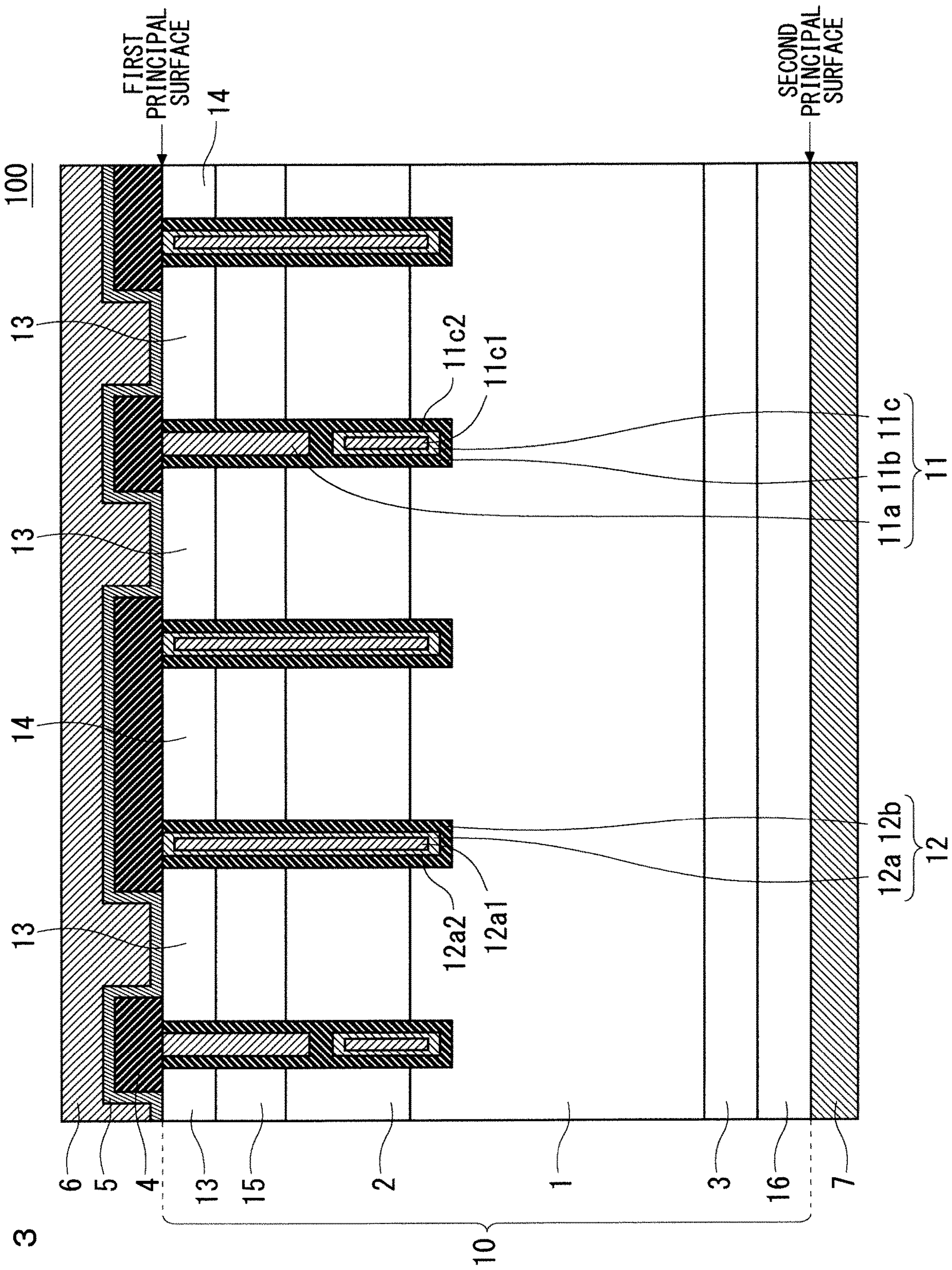
FIG. 3 is a cross-sectional view of a semiconductor device according to Embodiment 3.

FIG. 3 is a cross-sectional view of a semiconductor device 100 according to Embodiment 3, which is taken along the line A-A of FIG. 1 similarly to FIG. 2.

In Embodiment 3, a surface layer portion of the embedded electrode 11*c*, that is, a portion in contact with the gate trench insulating film 11*b* is made of non-doped polysilicon, and an inner portion thereof is made of doped polysilicon to which phosphorus has been added. Specifically, the embedded electrode 11*c* includes a doped polysilicon layer 11*c*1 which is located in a center portion of the embedded electrode 11*c* and to which phosphorus has been added, and a non-doped polysilicon layer 11*c*2 located outside of the doped polysilicon layer 11*c*1, as illustrated in FIG. 3.

Since the embedded electrode 11*c* includes the non-doped polysilicon layer 11*c*2 in its surface layer portion in Embodiment 3, the segregation of phosphorus at the interface between the embedded electrodes 11*c* and the gate trench insulating films 11*b* can be prevented, and hysteresis of positive gate leakage can be reduced. Since the doped polysilicon layer 11*c*1 is located inside the embedded electrode 11*c*, an increase in the electrical resistance of the embedded electrodes 11*c* can be prevented.

The dummy trench electrode 12*a* may have the same structure as that of the embedded electrode 11*c*. Specifically, a portion in contact with the dummy trench insulating film 12*b* may be made of non-doped polysilicon, and the inner portion thereof may be made of doped polysilicon to which phosphorus has been added. More specifically, the dummy trench electrode 12*a* may include a doped polysilicon layer 12*a*1 which is located in a center portion of the dummy trench electrode 12*a* and to which phosphorus has been added, and a non-doped polysilicon layer 12*a*2 located outside of the doped polysilicon layer 12*a*1, as illustrated in FIG. 3.

Embodiment 4

The structure of a semiconductor device 100 according to Embodiment 4 is basically identical to that in FIGS. 1 and 2. In Embodiment 4, the gate trench electrode 11*a* is made of a material excluding phosphorus (unlike Embodiment 1, the concentration of phosphorus contained in the embedded electrode 11*c* may be higher than that of phosphorus contained in the gate trench electrode 11*a*). Examples of the material of the gate trench electrode 11*a* include non-doped polysilicon, doped polysilicon to which nitrogen has been added, and metals. When compared to doped polysilicon to which phosphorus has been added as the material of the gate trench electrode 11*a* in Embodiment 1, non-doped polysilicon increases the electrical resistance of the gate trench electrode 11*a*, but doped polysilicon to which nitrogen has been added or the metals can reduce the electrical resistance of the gate trench electrode 11*a*.

Since the gate trench electrode 11*a* excludes phosphorus in Embodiment 4, the segregation of phosphorus at the interface between the gate trench electrodes 11*a* and the gate trench insulating films 11*b* can be prevented, and hysteresis of negative gate leakage can be reduced.

Embodiment 5

Figure 4:
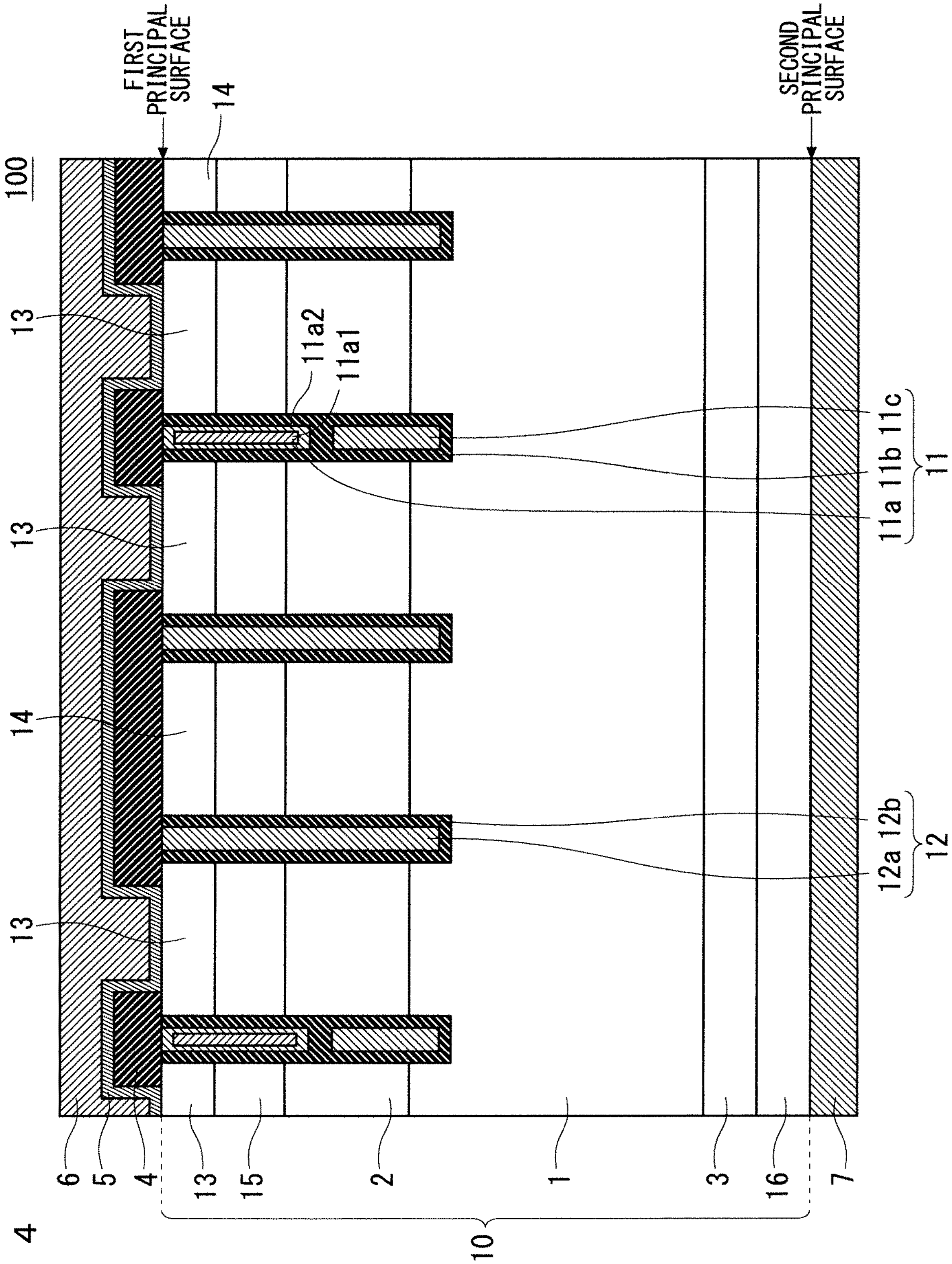
FIG. 4 is a cross-sectional view of a semiconductor device according to Embodiment 5.

FIG. 4 is a cross-sectional view of a semiconductor device 100 according to Embodiment 5, which is taken along the line A-A of FIG. 1 similarly to FIG. 2.

In Embodiment 5, a surface layer portion of the gate trench electrode 11*a*, that is, a portion in contact with the gate trench insulating film 11*b* is made of non-doped polysilicon, and the inner portion thereof is made of doped polysilicon to which phosphorus has been added. Specifically, the gate trench electrode 11*a* includes a doped polysilicon layer 11*a*1 which is located in a center portion of the gate trench electrode 11*a* and to which phosphorus has been added, and a non-doped polysilicon layer 11*a*2 located outside of the doped polysilicon layer 11*a*1, as illustrated in FIG. 4.

Since the gate trench electrode 11*a* includes the non-doped polysilicon layer 11*a*2 in its surface layer portion in Embodiment 5, the segregation of phosphorus at the interface between the gate trench electrodes 11*a* and the gate trench insulating films 11*b* can be prevented, and hysteresis of negative gate leakage can be reduced. Since the doped polysilicon layer 11*a*1 is located inside the gate trench electrode 11*a*, an increase in the electrical resistance of the gate trench electrode 11*a* can be prevented.

Embodiment 6

Figure 5:
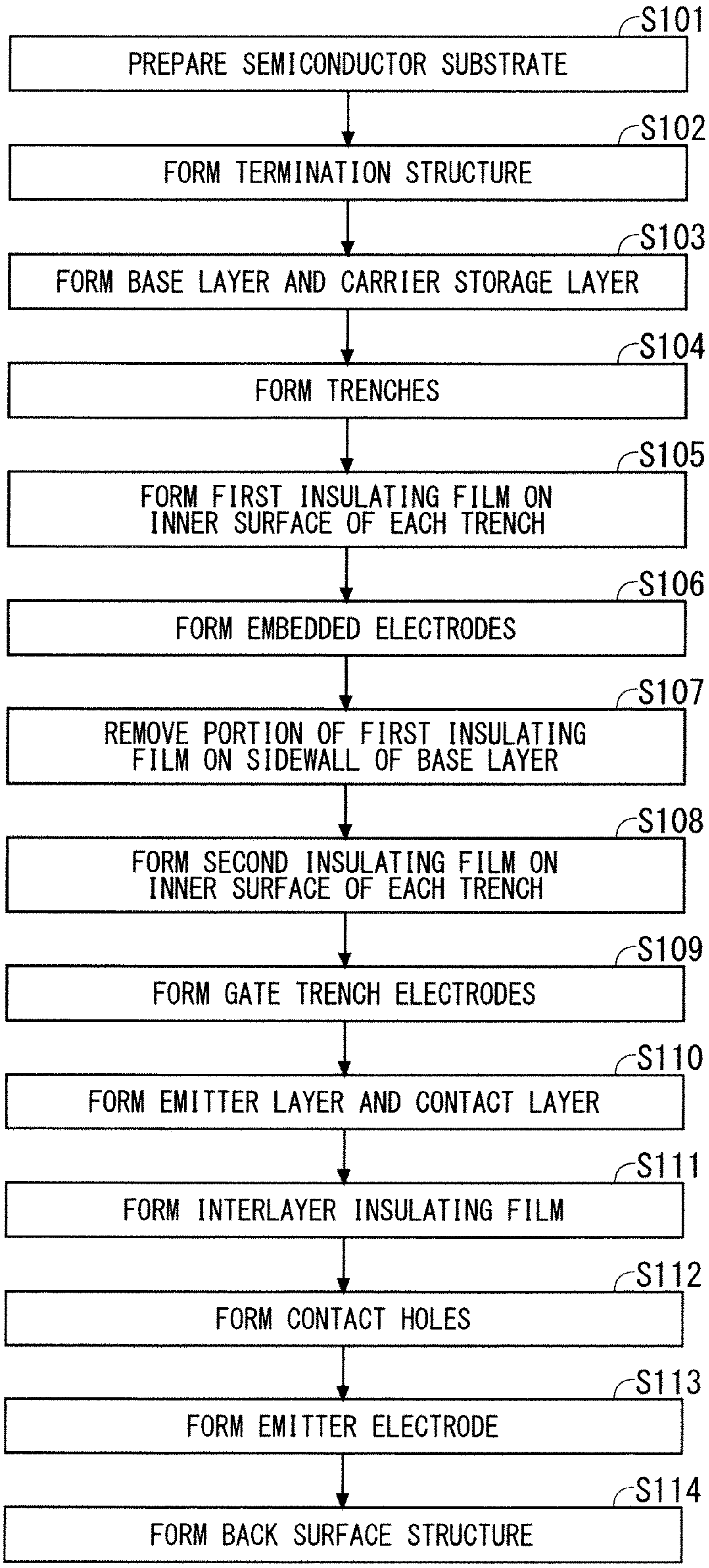
FIG. 5 illustrates a flowchart of a method for manufacturing the semiconductor devices according to Embodiments 1 to 5.

Embodiment 6 will describe a method for manufacturing the semiconductor devices 100 according to Embodiments 1 to 5. FIG. 5 illustrates a flowchart of the manufacturing method.

First, the semiconductor substrate 10 of the first conductivity type is prepared (Step S101). Then, a termination structure for withstanding a breakdown voltage (for example, a guard ring or a field limiting ring (FLR)) is formed in a terminal region outside an element forming region including e.g., the IGBT (Step S102).

Next, the carrier storage layer 2 and the base layer 15 are formed in the semiconductor substrate 10, by repeatedly performing a process of forming a mask using a photolithography technique (mask processing) and selectively implanting ions using the mask, on the first principal surface of the semiconductor substrate 10 (Step S103). Here, the remaining region of the first conductivity type under the carrier storage layer 2 becomes the drift layer 1.

Next, trenches for the active trench gates 11 are formed by selectively etching the first principal surface of the semiconductor substrate 10 (Step S104). Then, the first insulating film to be a part of the gate trench insulating film 11*b* is formed on an inner surface of each of the trenches (Step S105). Subsequently, the embedded electrode 11*c* is formed on the first insulating film in the trench (Step S106).

Next, a portion of the first insulating film formed on a sidewall of the base layer 15 in the trench is removed by etching using the embedded electrode 11*c* as a mask (Step S107). Then, the second insulating film to be a part of the gate trench insulating film 11*b* is formed on the embedded electrode 11*c* in the trench and on the sidewall of the base layer 15 by oxidation, chemical vapor deposition (CVD), or a combination of these (Step S108). Finally, formation of the gate trench electrode 11*a* on the second insulating film in each of the trenches (Step S109) completes the active trench gates 11.

For example, when the embedded electrode 11*c* is made of polysilicon, forming the second insulating film solely by oxidation probably causes the second insulating film formed on the embedded electrode 11*c* to have a non-uniform thickness. When the embedded electrode 11*c* is made of a metal, forming the second insulating film solely by oxidation causes a failure in forming an oxidized film on the embedded electrode 11*c*. Thus, when the embedded electrode 11*c* is made of particularly polysilicon or a metal, forming the second insulating film by a method including the CVD can increase electrical isolation between the embedded electrode 11*c* and the gate trench electrode 11*a*.

When the dummy trench gate 12 is formed in a part of the trenches formed in Step S104, the dummy trench insulating film 12*b* can be formed in Step S105 for forming the first insulating film or in Step S108 for forming the second insulating film, and the dummy trench electrode 12*a* can be formed in Step S106 for forming the embedded electrode 11*c* or in Step S109 for forming the gate trench electrode 11*a*. This can introduce the dummy trench gates 12 without increasing the number of manufacturing processes.

After completion of the active trench gates 11, the emitter layer 13 and the contact layer 14 are formed by repeating the mask process and the ion implantation (Step S110).

Then, the interlayer insulating film 4 is formed on the first principal surface of the semiconductor substrate 10 (Step S111). After the contact holes are formed in the interlayer insulating film 4 (Step S112), the emitter electrode 6 is formed on the interlayer insulating film 4 (Step S113).

Finally, a back surface structure including the buffer layer 3, the collector layer 16, and the collector electrode 7 is formed on the second principal surface of the semiconductor substrate 10 (Step S114), thus completing the semiconductor device 100.

The heat treatment processes for activating the ion-implanted impurities may be performed after each of ion implantation processes or collectively after a plurality of ion implantation processes. The order of the processes may be appropriately reshuffled.

Embodiments can be freely combined, and appropriately modified or omitted.

What is claimed is:

1. A semiconductor device, comprising:

a semiconductor substrate including a first principal surface, a second principal surface, and a drift layer of a first conductivity type;

a carrier storage layer of the first conductivity type formed closer to the first principal surface than the drift layer is to the first principal surface in the semiconductor substrate, the carrier storage layer being higher in peak impurity concentration than the drift layer;

a base layer of a second conductivity type formed closer to the first principal surface than the carrier storage layer is to the first principal surface in the semiconductor substrate;

an emitter layer of the first conductivity type and a contact layer of the second conductivity type that are formed in contact with the first principal surface in the semiconductor substrate; and an active trench gate formed in a trench that is in contact with the emitter layer, the base layer, and the carrier storage layer to reach the drift layer, the active trench gate including:

a gate trench insulating film formed on an inner wall of the trench;

a gate trench electrode; and an embedded electrode closer to the second principal surface than the gate trench electrode is to the second principal surface, the gate trench electrode and the embedded electrode being formed on the gate trench insulating film in the trench and being insulated from each other, the gate trench insulating film includes a portion formed closer to the second principal surface than the embedded electrode is to the second principal surface, wherein the embedded electrode is lower in phosphorus concentration than the gate trench electrode, and both the embedded electrode and the gate trench electrode contain phosphorus.

2. A method for manufacturing the semiconductor device according to claim 1, comprising a step of forming the active trench gate including the steps of:

(a) forming the trench in the first principal surface of the semiconductor substrate;

(b) forming a first insulating film on an inner surface of the trench;

(c) forming the embedded electrode on the first insulating film in the trench;

(d) removing a portion of the first insulating film on a sidewall of the base layer in the trench after step (c);

(e) forming a second insulating film on the embedded electrode in the trench and on the sidewall of the base layer by a method including chemical vapor deposition (CVD) after step (d); and (f) forming the gate trench electrode on the second insulating film in the trench.

3. The semiconductor device according to claim 1, wherein at least a surface layer portion of the gate trench electrode excludes phosphorus.

4. The semiconductor device according to claim 3, wherein the surface layer portion of the gate trench electrode is made of non-doped polysilicon, and a portion inner than the surface layer portion of the gate trench electrode is made of doped polysilicon to which phosphorus has been added.

5. A method for manufacturing the semiconductor device according to claim 3, comprising a step of forming the active trench gate including the steps of:

(a) forming the trench in the first principal surface of the semiconductor substrate;

(b) forming a first insulating film on an inner surface of the trench;

(c) forming the embedded electrode on the first insulating film in the trench;

(d) removing a portion of the first insulating film on a sidewall of the base layer in the trench after step (c);

(e) forming a second insulating film on the embedded electrode in the trench and on the sidewall of the base layer by a method including chemical vapor deposition (CVD) after step (d); and (f) forming the gate trench electrode on the second insulating film in the trench.

6. The semiconductor device according to claim 1, wherein an upper portion of the embedded electrode is closer to the first principal surface than a boundary between the drift layer and the carrier storage layer is to the first principal surface.

7. The semiconductor device according to claim 1, wherein a lower portion of the gate trench electrode is closer to the second principal surface than the boundary between the base layer and the carrier storage layer is to the second principal surface.

8. The semiconductor device according to claim 6, wherein a lower portion of the gate trench electrode is closer to the second principal surface than the boundary between the base layer and the carrier storage layer is to the second principal surface.

9. The semiconductor device according to claim 1, wherein the emitter layer and the embedded electrode have a same potential.

10. The semiconductor device according to claim 1, further comprising an emitter electrode on the first principal surface and electrically connected to the emitter layer, wherein the embedded electrode is electrically connected to the emitter electrode such that the emitter layer and the embedded electrode have a same potential.

* * * * *